United States Patent
Kato et al.

(10) Patent No.: US 7,995,324 B2
(45) Date of Patent: Aug. 9, 2011

(54) ELECTROSTATIC ATTRACTION APPARATUS FOR GLASS SUBSTRATE AND METHOD OF ATTRACTING AND RELEASING THE SAME

(75) Inventors: Mitsuo Kato, Hiroshima (JP); Shigenari Horie, Hiroshima (JP); Tatsufumi Aoi, Hiroshima (JP); Masaki Kawano, Hiroshima (JP); Yoshitaka Tsumoto, Hiroshima (JP); Hiroaki Ogasawara, Hiroshima (JP); Toshiro Kobayashi, Hiroshima (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 411 days.

(21) Appl. No.: 12/225,167

(22) PCT Filed: Dec. 26, 2006

(86) PCT No.: PCT/JP2006/325957
§ 371 (c)(1),
(2), (4) Date: Oct. 23, 2008

(87) PCT Pub. No.: WO2007/108192
PCT Pub. Date: Sep. 27, 2007

(65) Prior Publication Data
US 2009/0273879 A1        Nov. 5, 2009

(30) Foreign Application Priority Data

Mar. 20, 2006   (JP) ................................. 2006-076033

(51) Int. Cl.
*H01L 21/683* (2006.01)
*H02N 13/00* (2006.01)

(52) U.S. Cl. ........ 361/234; 228/44.7; 228/102; 228/212
(58) Field of Classification Search .................. 361/234; 228/44.7, 102, 212
See application file for complete search history.

(56) References Cited

U.S. PATENT DOCUMENTS 6,949,144 B2 *  9/2005  Sasaoka et al. ............... 118/719
(Continued)

FOREIGN PATENT DOCUMENTS

JP            6-85045           3/1994
(Continued)

OTHER PUBLICATIONS

International Search Report mailed Apr. 17, 2007 for International Application No. PCT/JP2006/325957.

*Primary Examiner* — Stephen W Jackson
*Assistant Examiner* — Tien Mai
(74) *Attorney, Agent, or Firm* — Wenderoth, Lind & Ponack, L.L.P.

(57) ABSTRACT

An object is providing an electrostatic attraction apparatus and an attracting/releasing method capable of reliably attracting and quickly releasing a glass substrate. An attraction force for attracting a glass substrate is obtained according to the physical properties of the glass substrate. In addition to obtaining an attraction voltage ($V_c(t)$) required for obtaining the attraction force, a holding voltage ($V_h(t)$) for holding an attraction state and a release voltage ($V_r(t)$) for releasing the glass substrate are also obtained (S1 to S7). Attraction time period ($t_c$) is actually measured and if this measured time is different from a preset attraction time ($t_1$), the holding voltage ($V_h(t)$) and the release voltage ($V_r(t)$) are recalculated according to the actually measured attraction time period ($t_c$) (S8 to S11).

20 Claims, 11 Drawing Sheets

U.S. PATENT DOCUMENTS

2006/0158822 A1  7/2006  Kondo et al.

FOREIGN PATENT DOCUMENTS

| JP | 9-213780 | 8/1997 |
| JP | 11-163111 | 6/1999 |
| JP | 11-340307 | 12/1999 |
| JP | 2004-047512 | * 2/2004 |
| JP | 2005-32858 | 2/2005 |
| JP | 2005-209768 | 8/2005 |
| JP | 2005-245106 | 9/2005 |

* cited by examiner

_US 7,995,324 B2_

ELECTROSTATIC ATTRACTION APPARATUS FOR GLASS SUBSTRATE AND METHOD OF ATTRACTING AND RELEASING THE SAME

TECHNICAL FIELD

The present invention relates to an electrostatic attraction apparatus for a glass substrate and a method of attracting and releasing a glass substrate.

BACKGROUND ART

When a process is performed on a semiconductor substrate or a glass substrate, the semiconductor substrate or the glass substrate is reliably held while being attracted to a supporting table by an electrostatic attraction apparatus utilizing an electrostatic attraction force.

Patent Document 1: JP-A 06-085045
Patent Document 2: JP-A 09-213780
Patent Document 3: JP-A 11-340307

DISCLOSURE OF THE INVENTION

Problems to be Solved by the Invention

A conventional electrostatic attraction apparatus for a glass substrate is shown in FIGS. 7(a) and 7(b).

A conventional electrostatic attraction apparatus for a glass substrate includes a ceramic attraction plate 33 in which multiple positive electrodes 31 and multiple negative electrodes 32 are disposed inside, a positive voltage power source unit 34 for supplying a positive direct-current voltage to the positive electrodes 31, and a negative voltage power source unit 35 for supplying a negative direct-current voltage to the negative electrodes 32.

In order to attract a glass substrate 41, the glass substrate 41 is brought into contact with a surface of the attraction plate 33 and direct-current voltages are applied from the positive voltage power source unit 34, and the negative voltage power source unit 35 to the positive electrodes 31 and the negative electrode 32, respectively, to generate electric charges having different polarities on mutually facing surfaces of the attraction plate 33 and the glass substrate 44. By use of an electrostatic attraction force attributed to these electric charges, the substrate 41 is attracted to and held on the surface of the attraction plate 33. For example, as shown in FIG. 7(b), the bipolar electrostatic attraction apparatus is configured of the positive electrodes 31 and the negative electrodes 32 arranged alternately in parallel inside the attraction plate 33, thereby reliably attracting even a large-sized glass substrate. Particularly, in the case of a vacuum deposition apparatus for organic EL (electroluminescence) elements, the electrostatic attraction apparatus is required to have an attraction force equal to or greater than the weight of the glass substrate 41, because the glass substrate 41 should be supported on a vertically lower surface side of the attraction plate 33 in some cases.

In the conventional electrostatic attraction apparatus, applied voltage at the time of attraction is set constant and the attraction force is increased with time as shown in FIG. 8. In contrast, when the glass substrate 41 is released from the attraction plate 33, there is a problem that releasing the glass substrate 41 takes time.

Moreover, as described above, the attraction force equal to or greater than the weight of the glass substrate 41 is required to attract the glass substrate 41 to the lower surface side of the attraction plate 33. There may be a case of a failure to obtain a desired attraction force due to a gap generated between the attraction plate 33 and the glass substrate 41 when the glass substrate 41 is deformed by its own weight. Here, the deformation of the glass substrate 41 attributable to its own weight was measured where the glass substrate 41 has a width of about 600 mm, for example. As a result, the central part of the glass substrate 41 is deflected as shown in FIG. 9(a) and about a 2 mm difference is generated between the central part and the end parts. Moreover, the attraction force has a relation, as shown in FIG. 9(b), with the gap between the attraction plate 33 and the glass substrate 41. The attraction force is reduced along the increase in the gap between the attraction plate 33 and the glass substrate 41. When the gap is equal to or above 50 µm, even if the attraction force is greater than its own weight an actual attraction force is nearly 0. Accordingly, the attraction force greater than its own weight is not generated in some cases where the glass substrate 41 is deformed by a certain large amount or more. In particular, this problem has become more serious in recent years along an increase in the size of the glass substrate 41.

Moreover, surface potential is generated around the attraction plate 33 by the positive electrodes 31 and the negative electrodes 32. Accordingly, particles may adhere to the attraction plate 33 due to this surface potential. For example, when the surface potential on the glass substrate 41 attracted to the attraction plate 33 was measured along an arrow A shown in FIG. 7(b), it was observed that a surface potential was generated as shown in FIG. 10 and particularly that large surface potential was generated on one end portion thereof. Due to this surface potential, when particles adhere to an attracting surface of the attraction plate 33, for example, a gap may be generated between the attraction plate 33 and the glass substrate 41. Thus, the attraction force may be reduced as described previously. Meanwhile, as the particles exist around the glass substrate 41, the particles may adhere to the glass substrate 41 when the glass substrate 41 is attracted or released. Accordingly, existence of the particles around the glass substrate 41 is undesirable in light of the process. Further, excessively large surface potential may also cause adverse effects on devices formed on the glass substrate 41.

In addition, as shown in FIG. 11(a), volume resistivity of the glass substrate 41 has a physical characteristic that the volume resistivity is reduced rapidly with an increase in the temperature. For example, when the temperature of the glass substrate 41 is increased by 10° C., the volume resistivity thereof is reduced by one digit, and accordingly, the time necessary for attracting is shortened by applying even the same voltage. This fact means that the attraction force of the glass substrate 41 varies depending on the temperature of the glass substrate 41, and such a characteristic also acts as a factor for inhibiting stable attracting and releasing operations. In fact, when variation in the attraction force relative to the change in the temperature of the glass substrate 41 was investigated, it was observed as shown in FIG. 11(b) that a change in the temperature by only several degrees results in a significant change in the attraction force. In the vapor deposition process and the like, in particular, the temperature of the glass substrate varies from a room temperature to a temperature equal to or above 50° C. during the process. Thus, significant changes in time necessary for attraction and release can be predicted. Therefore, it is difficult to execute stable attracting and releasing operation without considering this factor.

The present invention has been made in view of the foregoing problems and an object thereof is to provide an electrostatic attraction apparatus for a glass substrate and a method of attracting and releasing the same, which are capable of reliably attracting and quickly releasing the same.

Means for Solving the Problems

An electrostatic attraction apparatus for a glass substrate according to a first invention for solving the problems, comprising: an attraction plate made of a dielectric in which at least one first electrode and at least one second electrode are disposed inside; a first power source for applying a voltage to the first electrode; a second power source for applying a voltage, having an opposite polarity of the first electrode, to the second electrode; attraction detecting elements for detecting attraction of a glass substrate to the attraction plate; temperature detecting elements for measuring or estimating a temperature of the glass substrate; and controlling elements for controlling the voltages of the first power source and the second power source on the basis of detection results from the attraction detecting elements and the temperature detecting elements, in which the glass substrate is electrostatically attracted to the attraction plate and then the glass substrate is released from the attraction plate by application of the voltages to the first electrode and the second electrode. Here, the controlling elements presets a size, specific gravity, and electric resistivity of the glass substrate and presets an attraction time period necessary for attraction of the glass substrate, a holding time period for holding an attraction state of the glass substrate, and a release time period necessary for releasing the glass substrate; the controlling elements finds an attraction force necessary for attraction of the glass substrate on the basis of the size and the specific gravity of the glass substrate and the attraction time period; the controlling elements finds an attraction voltage necessary for obtaining the attraction force and finds a holding voltage for holding the attraction state and a release voltage for releasing on the basis of the electric resistivity and the temperature of the glass substrate measured or estimated by the temperature detecting elements; the controlling elements measures an actually measured attraction time period taken to complete attraction of the glass substrate when attraction of the glass substrate is detected by the attraction detecting elements after application of the attraction voltage; the controlling elements compares the preset attraction time period with the actually measured attraction time period and recalculates the holding voltage and the release voltage on the basis of the actually measured attraction time period when the preset attraction time period is different from the actually measured attraction time period; and the controlling elements holds the attraction state and releases the glass substrate by use of the recalculated holding voltage and the release voltage.

An electrostatic attraction apparatus for a glass substrate according to a second invention for solving the problems is the electrostatic attraction apparatus for a glass substrate according to the first invention, wherein the controlling elements gradually reduces at least one of the attraction voltage, the holding voltage, and the release voltage with time.

An electrostatic attraction apparatus for a glass substrate according to a third invention for solving the problems is the electrostatic attraction apparatus for a glass substrate according to any one of the first and second inventions, wherein the attraction detecting elements is at least one of a first ammeter for measuring an electric current flowing to the first electrode and a second ammeter for measuring an electric current flowing to the second electrode, and the controlling elements detects attraction of the glass substrate to the attraction plate by detecting the change in an electric current value flowing to any of the first ammeter and the second ammeter.

An electrostatic attraction apparatus for a glass substrate according to a fourth invention for solving the problems is the electrostatic attraction apparatus for a glass substrate according to any one of the first and second inventions, wherein the attraction detecting elements is a position sensor provided around an attracting surface of the attraction plate, and the controlling elements detects the attraction of the glass substrate to the attraction plate by using the position sensor.

An electrostatic attraction apparatus for a glass substrate according to a fifth invention for solving the problems is the electrostatic attraction apparatus for a glass substrate according to any one of the first to fourth inventions, further comprising deformation detecting elements for estimating or measuring the amount of deformation of the glass substrate, wherein the controlling elements finds the attraction force on the basis of the amount of deformation of the glass substrate thus estimated or measured.

An electrostatic attraction apparatus for a glass substrate according to a sixth invention for solving the problems is the electrostatic attraction apparatus for a glass substrate according to anyone of the first to fifth inventions, further comprising a conductive member which covers the surfaces of the attraction plate other than the attracting surface and which is grounded.

A method of attracting and releasing a glass substrate according to a seventh invention for solving the problems, comprising: presetting a size, specific gravity, and electric resistivity of a glass substrate and presetting an attraction time period necessary for attraction of the glass substrate, a holding time period for holding the attraction state of the glass substrate, and a release time period necessary for releasing the glass substrate; finding an attraction force necessary for attraction of the glass substrate on the basis of the size and the specific gravity of the glass substrate and the attraction time period; measuring or estimating a temperature of the glass substrate; finding an attraction voltage necessary for obtaining the attraction force and finding a holding voltage for holding the attraction state and a release voltage for releasing on the basis of the electric resistivity and the temperature of the glass substrate thus measured or estimated; measuring an actually measured attraction time period taken to complete attraction of the glass substrate by detecting attraction of the glass substrate after application of the attraction voltage; comparing the preset attraction time period with the actually measured attraction time period and recalculating the holding voltage and the release voltage on the basis of the actually measured attraction time period when the preset attraction time period is different from the actually measured attraction time period; and holding the attraction state and then releasing the glass substrate by applying the recalculated holding voltage and the release voltage to at least one first electrode and at least one second electrode having mutually different polarities and being disposed inside the attraction plate made of a dielectric.

A method of attracting and releasing a glass substrate according to an eighth invention for solving the problems is the method of attracting and releasing a glass substrate according to the sixth invention, wherein at least one of the attraction voltage, the holding voltage, and the release voltage is gradually reduced with time.

A method of attracting and releasing a glass substrate according to a ninth invention for solving the problems is the method of attracting and releasing a glass substrate according to any one of the seventh and eighth inventions, wherein attraction of the glass substrate to the attraction plate is detected by detecting the change in at least one of electric current values flowing to the first electrode and the second electrode.

A method of attracting and releasing a glass substrate according to a tenth invention for solving the problems is the method of attracting and releasing a glass substrate according to any one of the seventh and eighth inventions, wherein attraction of the glass substrate to the attraction plate is detected by use of a position sensor provided around an attracting surface of the attraction plate.

A method of attracting and releasing a glass substrate according to an eleventh invention for solving the problems is the method of attracting and releasing a glass substrate according to any one of the seventh to tenth inventions, wherein the amount of deformation of the glass substrate is estimated or measured, and the attraction force is found on the basis of the amount of the glass substrate thus estimated or measured.

A method of attracting and releasing a glass substrate according to a twelfth invention for solving the problems is the method of attracting and releasing a glass substrate according to any one of the seventh to eleventh inventions, wherein electric potential of the surfaces of the attraction plate other than the attracting surface is set equal to 0 by use of a conductive member which covers the surfaces of the attraction plate other than the attracting surface and is grounded.

Effects of the Invention

According to the present invention, when the glass substrate is attracted, the necessary attraction force and the voltages necessary for the attraction force are found by grasping the size, the specific gravity, the electric resistivity, the temperature of the substrate, the amount of deformation, and the like, and the voltages necessary for holding the attraction state and releasing are controlled on the basis of the attraction time period actually taken. Therefore, it is possible to perform attracting and releasing operations quickly and stably even if there is a change in the temperature of the substrate or variation in the attraction time period.

Moreover, according to the present invention, the surfaces of the attraction plate other than the attracting surface is shielded by the conductive member made of metal or the like and is set to 0 electric potential. Therefore, it is possible to prevent adhesion of particles to the attraction plate and to avoid inhibition of the attracting and releasing operations of the glass substrate.

EXPLANATION OF REFERENCE NUMERALS

1 FIRST ELECTRODE
2 SECOND ELECTRODE
3 ATTRACTION PLATE
4 FIRST POWER SOURCE UNIT
5 SECOND POWER SOURCE UNIT
6 FIRST AMMETER
7 SECOND AMMETER
8 CONTROL UNIT
9 TEMPERATURE SENSOR
10 POSITION SENSOR
11 GLASS SUBSTRATE
21 METAL COVER

BEST MODES FOR CARRYING OUT THE INVENTION

Some embodiments of an electrostatic attraction apparatus for a glass substrate and an attracting and releasing method according to the present invention will be described with reference to FIG. 1 to FIG. 6.

Embodiment 1

Figure 1:
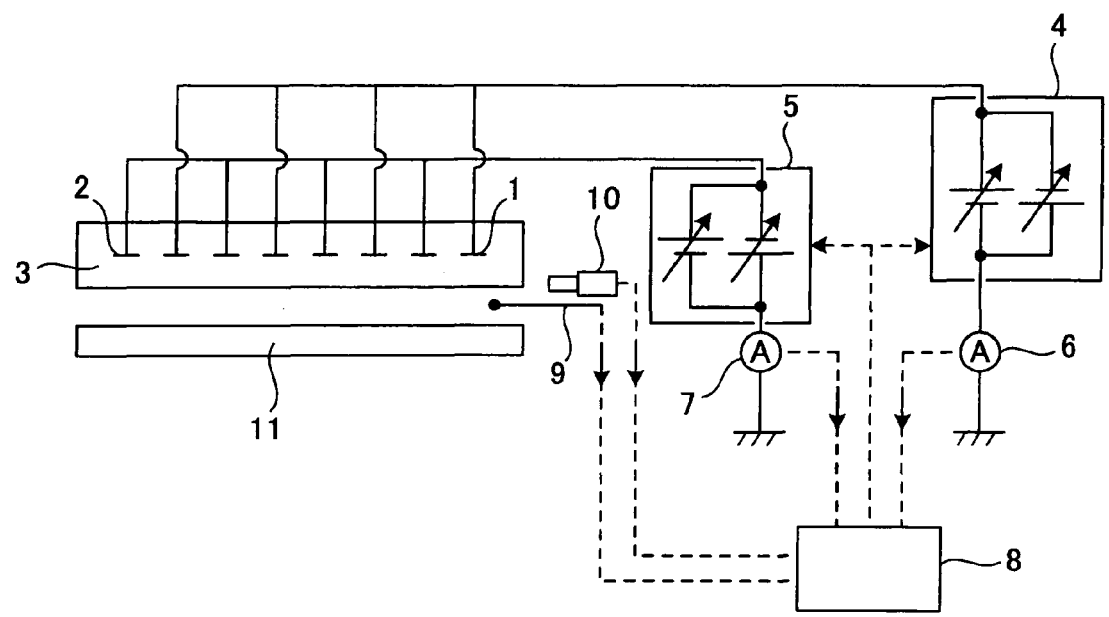
FIG. 1 is a schematic diagram showing an example of an embodiment of an electrostatic attraction apparatus for a glass substrate according to the present invention.

FIG. 1 is a schematic diagram of an electrostatic attraction apparatus for a glass substrate according to the present invention.

As shown in FIG. 1, an electrostatic attraction apparatus for a glass substrate of this embodiment includes an attraction plate 3 formed of a dielectric body made of a ceramic or the like in which at least one first electrode 1 and at least one second electrode 2 are disposed inside, a first power source unit 4 for applying a voltage to the first electrode 1, a second power source unit 5 for applying a voltage having an opposite polarity to the voltage to be applied to the first electrode 1 to the second electrode 2, a first ammeter 6 for measuring an electric current flowing to the first electrode 1, a second ammeter 7 for measuring an electric-current flowing to the second electrode 2, and a control unit 8 (controlling elements) for measuring electric current values of the first ammeter 6 and the second ammeter 7, and controlling the voltages to be outputted from the first power source unit 4 and the second power source unit 5.

The electrostatic attraction apparatus for a glass substrate of this embodiment constitutes a bipolar electrostatic attraction apparatus by arranging the first electrodes 1 and the second electrodes 2 inside the attraction plate 3 alternately in parallel, and is possible to attract a large-sized glass substrate 11 reliably. Here, when the glass substrate 11 is larger, multiple attraction plates 3 can be used, which includes the multiple first electrodes 1 and the multiple second electrodes 2 so as to attract the larger glass substrate 11 by the multiple attraction plates 3.

Moreover, the first power source unit 4 and the second power source unit 5 are capable of applying not only a direct-current voltage of one polarity but also a direct-current voltage of a reverse polarity, and are also capable of applying an alternating-current voltage.

In addition, at least one temperature sensor 9 (an infrared type or a thermocouple type: temperature detecting elements) for measuring a temperature of the glass substrate 11 is provided around the attraction plate 3. The temperature sensor 9 measures and inputs the temperature of the glass substrate 11 to the control unit 8.

Moreover, at least one position sensor 10 (deformation detecting elements) for measuring the amount of deformation of the glass substrate 11 is similarly provided around the attraction plate 3. The position sensor 10 measures and inputs the amount of deformation of the glass substrate 11 to the control unit 8.

Meanwhile, the control unit 8 can detect whether or not the glass substrate 11 attracted to the attraction plate 3 by detecting at least one of changes in electric current values measured by the first ammeter 6 and the second ammeter 7. In this case, the first ammeter 6 and the second ammeter 7 function as attraction detecting elements. Alternatively, it is possible to detect whether or not the glass substrate 11 attracted to the attraction plate 3 by using the position sensor 10 as the attraction detecting elements.

When the glass substrate 11 is attracted, the glass substrate 11 is brought into contact with the surface of the attraction plate 3. With that, electric charges having different polarities are generated on mutually facing surfaces of the attraction plate 3 and the glass substrate 14 by applying direct-current voltages from the first power source unit 4 and the second power source unit 5 to the first electrodes 1 and the second electrodes 2. The substrate 11 is attracted and held to the surface of the attraction plate 3 by an electrostatic attraction force attributable to these electric charges. Then, when the attracted glass substrate 11 is released, the glass substrate 11 is released by applying direct-current voltages having reverse polarities to the voltages applied at the time of attraction or alternating-current voltages to the first electrodes 1 and the second electrodes 2 and thereby reducing the electric charges accumulated at the time of attraction.

Figure 2:
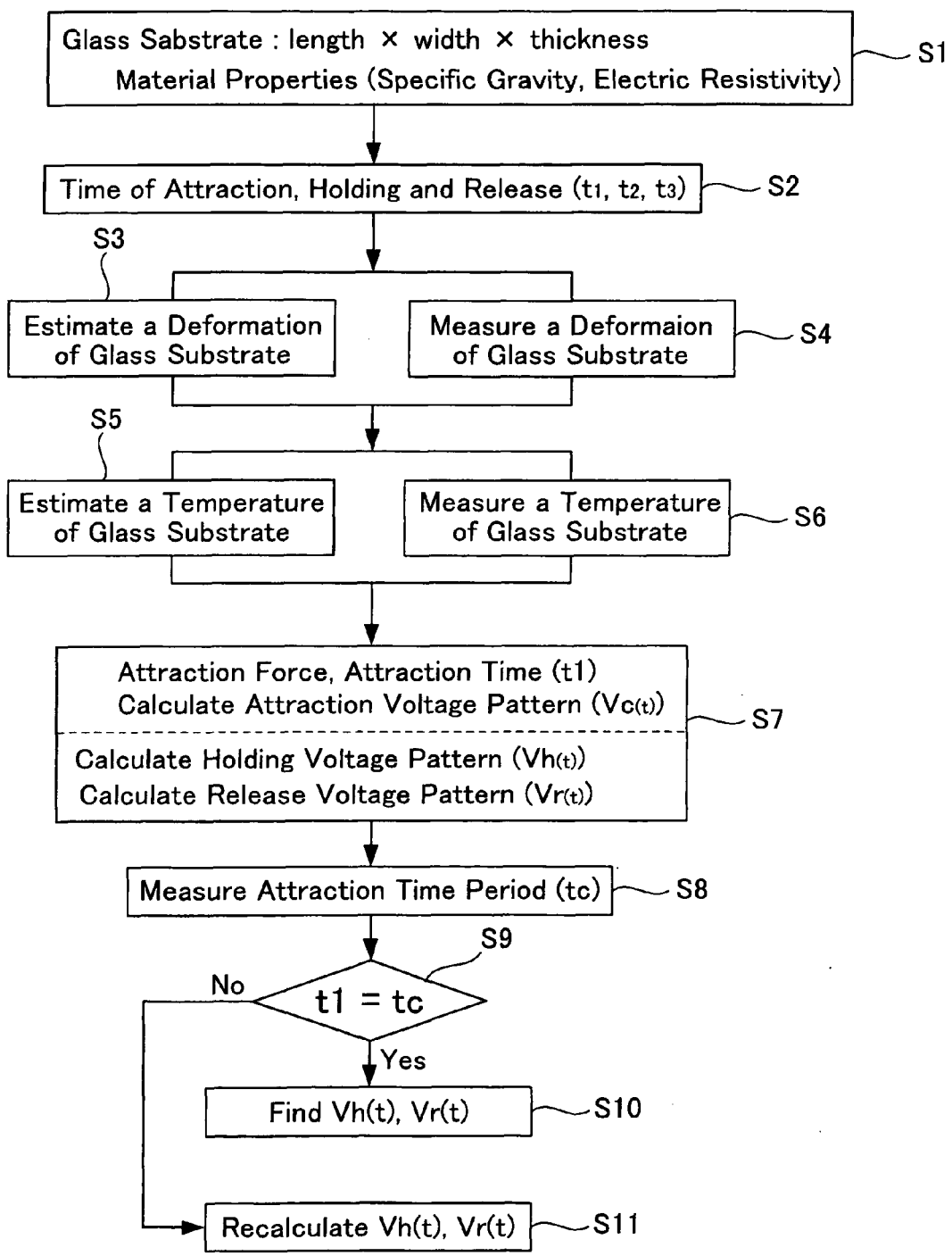
FIG. 2 is a flowchart showing an example of the embodiment of a method of attracting and releasing a glass substrate according to the present invention.
Figure 3:
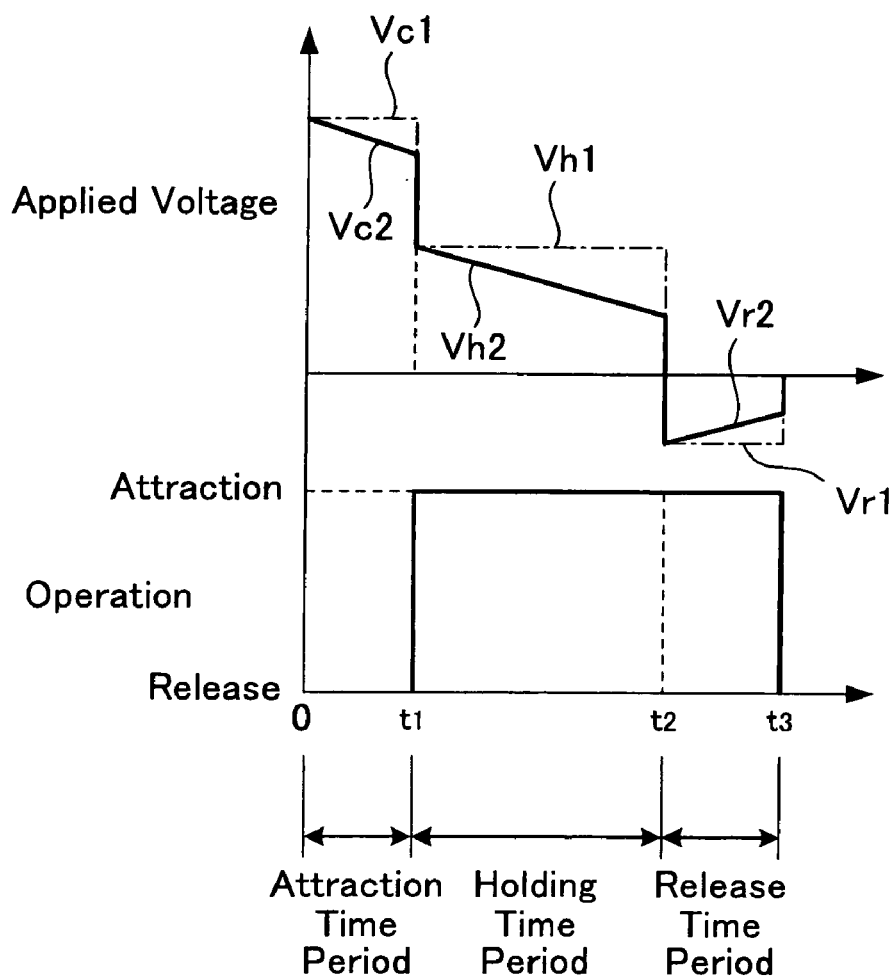
FIG. 3 is a view for explaining a pattern of voltage application in the method of attracting and releasing the glass substrate according to the present invention.

Next, a method of attracting and releasing a glass substrate in the electrostatic attraction apparatus having the above-described configuration will be described with reference to FIG. 2 and FIG. 3.

In a vacuum deposition apparatus for organic EL (electroluminescence) elements, for example, a vacuum deposition process is executed on a vertically lower surface side of the glass substrate 11 by attracting the glass substrate 11 to a vertically lower surface side of the attraction plate 3 using the electrostatic attraction apparatus having the above-described configuration. When the glass substrate 11 is attracted to the vertically lower side of the attraction plate 3, the electrostatic attraction apparatus is required to have an attraction force equal to or greater than the weight of the glass substrate 11. However, an excessively strong attraction force may inhibit release of the glass substrate 11.

Accordingly, in the present invention, the size (length×width×thickness) and material properties (specific gravity and electric resistivity) of the glass substrate 11 are defined as basic input conditions in consideration of physical properties of the glass substrate 11. Moreover, voltages and voltage patterns used at the time of attraction and release are con-trolled while considering an attraction completion time $t_1$ at which attraction is completed, a holding completion time $t_2$ at which a holding in the attraction state is completed, a release completion time $t_3$ at which release is completed, the amount of deformation of the glass substrate 11, and a temperature of the glass substrate 11.

To be more precise, the size (length×width×thickness) and the material properties (specific gravity and electric resistivity) of the glass substrate 11 are inputted prior to initiation of a process on the glass substrate 11 (Step S1), and the attraction completion time $t_1$, the holding completion time $t_2$, and the release completion time $t_3$ are inputted in response to the process on the glass substrate 11 (Step S2). The attraction completion time $t_1$ is a time from initiation of voltage application (t=0) to attraction of the glass substrate. The holding completion time $t_2$ is a time from the initiation of voltage application to completion of the holding in the attraction state of the glass substrate 11. The release completion time $t_3$ is a time from the initiation of voltage application to the release of the glass substrate 11. Here, as shown in FIG. 3, an attraction time period necessary for the attraction is equivalent to the attraction completion time $t_1$, a holding time period for the holding in the attraction state is equivalent to [the holding completion time $t_2$−the attraction completion time $t_1$], and a release time period necessary for the release is equivalent to [the release completion time $t_3$−the holding completion time $t_2$].

Next, the amount of deformation of the glass substrate 11 is estimated on the basis of the size (length×width×thickness) and the material properties (the specific gravity and the electric resistivity) of the glass substrate 11 (Step S3). Alternatively, the amount of deformation of the glass substrate 11 can be measured by the position sensor 10 (Step S4). Instead, the amount of deformation of the glass substrate 11 can be measured in advance. Here, it is preferable to dispose the position sensor 10 so as to be able to measure at least the central part of the glass substrate 11, which is estimated to have the largest amount of deformation. Then, variation in the attraction force associated with deformation of the glass substrate 11 is found by estimating or measuring the amount of deformation of the glass substrate 11.

Next, a temperature change of the glass substrate 11 is estimated on the basis of the size (length×width×thickness) and the material properties (the specific gravity and the electric resistivity) of the glass substrate 11, the attraction completion time $t_1$, the holding completion time $t_2$, and the release completion time $t_3$ of the glass substrate 11 (Step S5). Alternatively, the temperature of the glass substrate 11 can be measured by the thermocouple 9 (Step S6). Then, variation in the electric resistivity associated with the temperature change and variation in the attraction force are found by estimating or measuring the temperature of the glass substrate.

An attraction voltage pattern $V_c(t)$ in the attraction time period is found so as to achieve the most appropriate attraction force for attracting the glass substrate 11 under conditions found in the above-described steps. Then, based on the attraction voltage pattern $V_c(t)$ in the attraction time period, a holding voltage pattern $V_h(t)$ in the holding time period and a release voltage pattern $V_r(t)$ in the release time period are found (Step S7). The attraction voltage pattern $V_c(t)$, the holding voltage pattern $V_h(t)$, and the release voltage pattern $V_r(t)$ may be set constant as voltages $V_{c1}$, $V_{h1}$, and $V_{r1}$ shown in FIG. 3, or the applied voltages may be gradually reduced with time as voltages $V_{c2}$, $V_{h2}$, and $V_{r2}$ shown in FIG. 3. Considering the variation in the attraction force on the glass substrate 11 in particular, it is preferable to set the attraction voltage pattern $V_c(t)$ greater than the holding voltage pattern $V_h(t)$, and to reduce the holding voltage pattern $V_h(t)$ gradually with application time.

Variation in the electric current values on the first ammeter 6 and the second ammeter 7 is measured after applying the attraction voltage pattern $V_c(t)$. As apparent from FIG. 5 which will be described later, the electric current values on the first ammeter 6 and the second ammeter 7 become temporarily high when the glass substrate 11 is attracted to the attraction plate 3. Accordingly, determination that the glass substrate 11 is attracted to the attraction plate 3 can be made. At this time, an actually measured attraction time period $t_c$ taken to complete attraction from application of the attraction voltage pattern $V_c(t)$ to actual attraction of the glass substrate 11 onto the attraction plate 3 is measured (Step S8). Here, instead of confirmation of the attraction state based on the variation in the electric current values on the first ammeter 6 and the second ammeter 7, another way to confirm the attraction state and the attraction time period can be done by the position sensor 10.

When $t_1=t_c$ holds true, the actual attraction force is as estimated in the above-described step. The holding voltage pattern $V_h(t)$ and the release voltage pattern $V_r(t)$ calculated by use of $t_1$ are determined to be an applied voltage at the holding completion time $t_2$ and to be an applied voltage at the release completion time $t_3$ (Steps S9 and S10).

If $t_1=t_c$ does not hold true, the actual attraction force is not as estimated in the above-described step. Accordingly, the holding voltage pattern $V_h(t)$ and the release voltage pattern $V_r(t)$ are recalculated by use of the actually measured value $t_c$ and these values are determined to be the applied voltage at the holding completion time $t_2$ and to be the applied voltage at the release completion time $t_3$ (Steps S9 and S11). For example, the holding voltage $V_h(t)$ and the release voltage $V_r(t)$ become larger when $t_1<t_c$ while the holding voltage $V_h(t)$ and the release voltage $V_r(t)$ become smaller when $t_1>t_c$.

Here, the holding completion time $t_2$ and the release completion time $t_3$ do not always have to be fixed but may be modified appropriately together with the holding voltage pattern $V_h(t)$ and the release voltage pattern $V_r(t)$ in response to this actually measured attraction time period $t_c$. In particular, when the release voltage pattern $V_r(t)$ is too high or the release completion time $t_3$ is too long, there is a risk that the glass substrate 11 once released is attracted again. Therefore, when the actually measured attraction time period $t_c$ is shorter than the attraction completion time $t_1$ set preliminarily, for example, it is preferable to change the applied voltage to the holding voltage pattern $V_h(t)$ immediately after passage of the actually measured attraction time period $t_c$ by shortening the original attraction completion time $t_1$ or to re-set the release completion time $t_3$ for completing the application of the release voltage pattern $V_r(t)$ to a shorter time period.

In order to execute the attracting and releasing operations stably and reliably, it is important to set up the applied voltages and the time periods appropriately based on the above-described conditions. In the present invention, the holding voltage pattern $V_h(t)$ and the release voltage pattern $V_r(t)$, and moreover, the attraction completion time $t_1$, the release completion time $t_3$, and the like are modified in response to the actually measured attraction time period $t_c$ of the glass substrate 11 as described above. Accordingly, it is possible to ensure the attraction force for attracting the glass substrate 11 reliably and to avoid generation of excessive electric charges at the time of attraction. Consequently, it is also possible to release the glass substrate 11 quickly and reliably at the time of the release.

Now, showing an electrically equivalent circuit model of the electrostatic attraction apparatus for a glass substrate according to the present invention in FIG. 4, methods of calculating an attraction force, an attraction voltage, a holding voltage, and a release voltage in an electrostatic attraction method for a glass substrate according to the present invention will be described.

A relation between the attraction force and an electric potential difference at a gap section is found at first.

Figure 4:
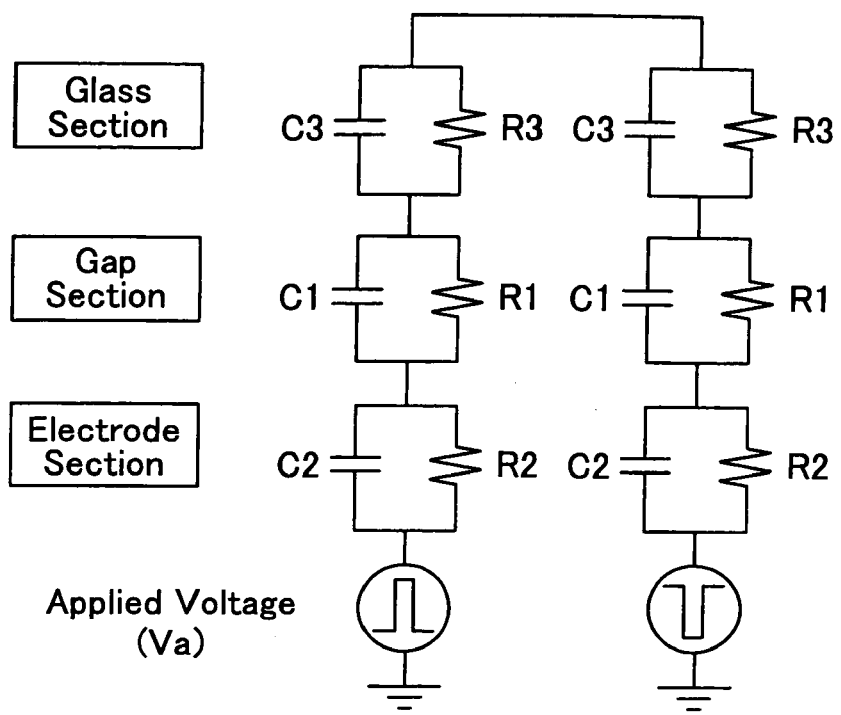
FIG. 4 is a view of an electrically equivalent circuit model of the electrostatic attraction apparatus for the glass substrate according to the present invention.

As shown in FIG. 4, in consideration of an electrically equivalent circuit model that expresses respective elements (a glass section, a gap section, and electrode sections) subject to application of the attraction voltage as a parallel circuit composed of resistors and capacitors as a concrete example, an attraction force F can be calculated by the following formula (1) as an electrostatic force to be applied to a gap d between a glass section (the glass substrate 11) and electrode sections (the electrodes 1 and 2):

$$F=Q^2/(2\in_0)=(C_1 V_g)^2/(2\in_0) \quad \text{formula (1)}$$

Here, F is the attraction force (N/m$^2$), Q is the amount of electric charges (c) to be accumulated in the gap, $C_1$ is a capacitance (F/m$^2$) of the gap section, $V_g$ is an electric potential difference (V) of the gap section, and $\in_0$ is dielectric constant (F/m) in vacuum.

In addition, the capacitance $C_1$ is expressed as a function of the gap d between the glass section and the electrode sections as shown in the following formula (2):

$$C_1=(\in_0\cdot\in_s)/d \quad \text{formula (2)}$$

Here, d is a distance (m) of the gap, $\in_0$ is the dielectric constant (F/m) in vacuum, and $\in_s$ is relative dielectric constant (F/m) of an object material.

For example, the gap d between the glass section and the electrode sections may be found by use of the amount of deformation of the glass substrate 11 estimated or actually measured in the above-described Steps S3 and S4, and the capacitance $C_1$ may be found by use of the obtained gap d.

Moreover, concerning capacitances $C_2$ and $C_3$ of the glass section and the electrode section, the capacitances $C_2$ and $C_3$ of the respective elements are calculated by the above-described formula (2) while replacing the gap d with a thickness of the glass section and a thickness of the electrode section.

Meanwhile, resistance components $R_1$, $R_2$, $R_3$ of the respective elements to be connected in parallel to capacitors $C_1$, $C_2$, and $C_3$ of the respective elements are expressed in the following formula (3) by use of electric resistivity $\rho_e$:

$$R=(\rho_e\cdot L)/S_0 \quad \text{formula (3)}$$

Here, R is resistance ($\Omega$/m$^2$) of each of the elements, $\rho_e$ is the electric resistivity ($\Omega\cdot$m) of each of the elements, L is the thickness of each of the elements (which is d in the case of the gap section) (m), and $S_0$ is an attraction area (m$^2$) of each of the elements.

The electric resistivity $\rho_e$ is uniquely given as a function of the material properties and the temperature of each of the elements, while the thickness L and the attraction area $S_0$ are determined by the size (length×width×thickness) and the like of the glass substrate 11. Therefore, the resistance R can be derived from the formula (3) as a function of the material property (the electric resistivity $\rho_e$), a temperature T, the size (the thickness L and the attraction area $S_0$), and the like.

Next, a relation between the electric potential difference $V_g$ of the gap section and an applied voltage $V_a$ is found.

As apparent from FIG. 4, the electric potential difference $V_g$ of the gap section is found as a transitional (time-variable) voltage which is shared in accordance with respective impedances of the glass section, the gap section, and the electrode sections relative to the applied voltage $V_a$. The respective impedances of the elements are determined by the capacitances $C_1$, $C_2$, and $C_3$ of the capacitors and the resistances $R_1$, $R_2$, and $R_3$. Therefore, considering the formulae (2) and (3), the electric potential difference $V_g$ of the gap section is found as a function of the material properties and the temperature of each of the elements, the size of the substrate, and a waveform of the applied voltage $V_a$.

Next, the attraction force F, a formula to find the applied voltage $V_a$, and a relation between attracting and releasing conditions are found.

As apparent from the formula (1), the attraction force F which is the electrostatic force is found as a function of the gap d between the glass section and the electrodes section, the material properties and the temperature of each of the elements, the size, and the waveform of the applied voltage $V_a$.

$$F=f(d,S_0,\rho_e,L,T,V) \qquad \text{formula (4)}$$

In the estimation using the formula (4) a condition where the attraction force F becomes sufficiently larger than an own weight obtained from the density of the glass substrate 11 is set up as a threshold condition for attracting and releasing the glass substrate 11, and a time passed over a time in this condition is used as the attraction time period $t_c$ or the release time period $t_r$.

Here, the function f in the formula (4) may be prepared to find the attraction force corresponding to respective input conditions at the time of attraction and release, by analytically obtaining or experimentally obtaining a calibration curve.

In order to confirm the effect of this embodiment, time periods for attracting and releasing the glass substrate in the conventional attracting and releasing method are measured.

Figure 5A:
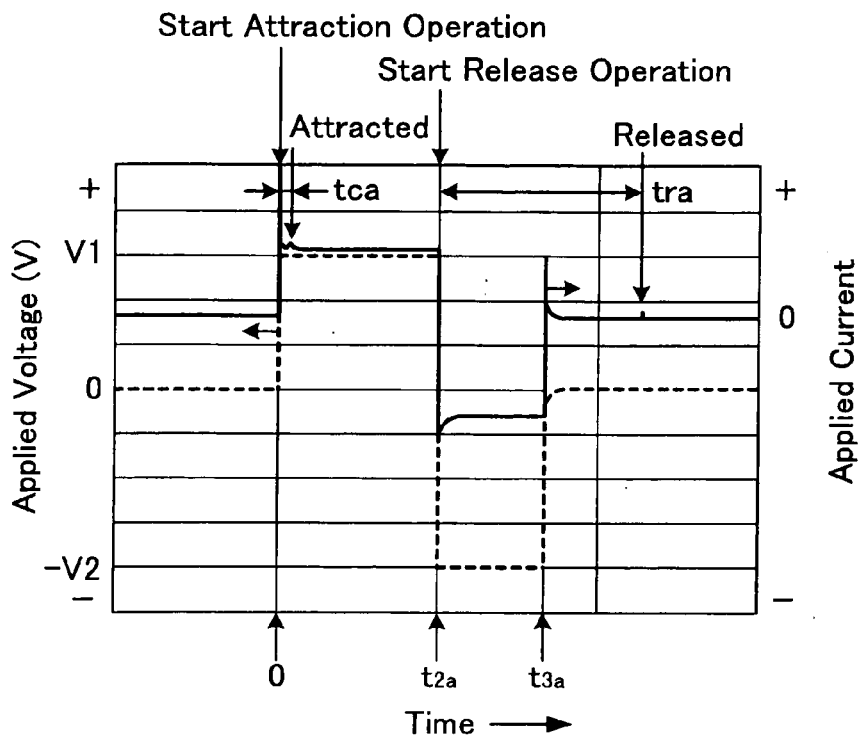
FIGS. 5(a) and 5(b) show a measurement result of attraction and release time periods for the glass substrate in a conventional attracting and releasing method, and a measurement result of attraction and release time periods for the glass substrate in the attracting and releasing method according to the present invention.
Figure 5B:
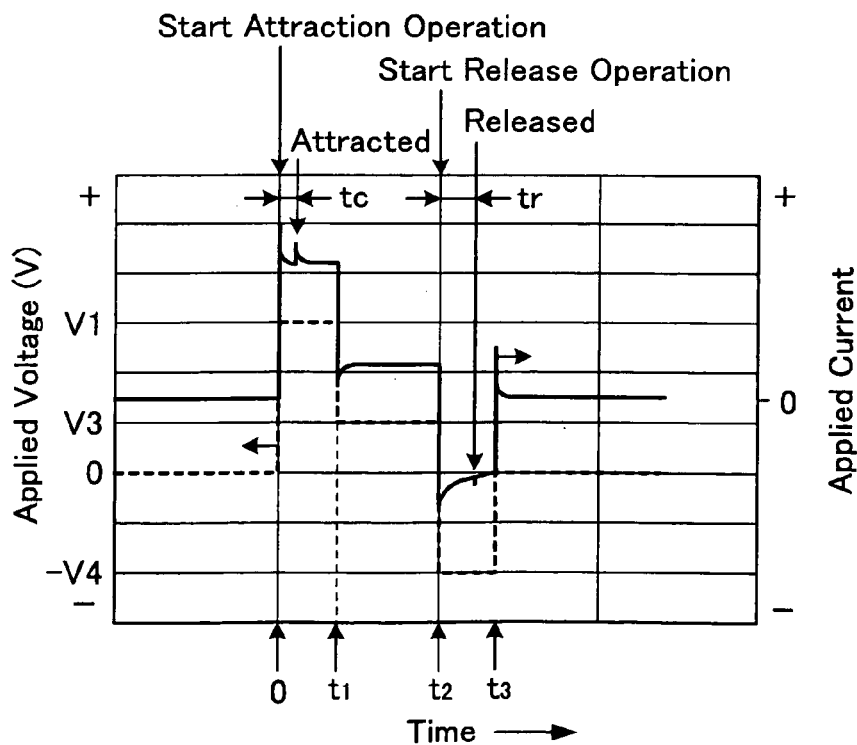

Meanwhile, time periods for attracting and releasing the glass substrate are also measured by use of the simplest voltage pattern of this embodiment. FIG. 5(a) shows a measurement result of the conventional method and FIG. 5(b) shows a measurement result of this embodiment. As for the pattern of the applied voltages in this embodiment, the attraction completion time $t_1$, the holding completion time $t_2$, and the release completion time $t_3$ are fixed to preset time respectively and the applied voltages in the respective time are set constant as the voltages $V_{c1}$, $V_{h1}$, $V_{r1}$ in FIG. 3. Note that, although specific numerical values are omitted in FIGS. 5(a) and 5(b), voltage axes and time axes are defined in the same scale.

As shown in FIG. 5(a), in the conventional attracting and releasing method, an attraction voltage [V1] is applied at the same time as initiation of the attracting operation (t=0)), and the attraction voltage [V1] is maintained until initiation of the releasing operation (t=$t_{2a}$). Subsequently, a release voltage [−V2 (V2 is a positive number)] is applied at the same time as initiation of the releasing operation (t=$t_{2a}$), and the release voltage [−V2] is maintained until completion of the releasing operation (t=$t_{3a}$). Note that, in the drawing, voltage set-up values are illustrated with a dotted line while electric current measured values are illustrated with a solid line. Viewing the variation in the applied electric current values relative to the applied voltages, although the glass substrate is attracted in a short actually measured attraction time period $t_{ca}$ after application of the attraction voltage [V1], this attraction voltage [V1] is maintained until initiation of the releasing operation (t=$t_{2a}$). For this reason, many electric charges are generated so that the glass substrate cannot be released on and before completion of the releasing operation (t=$t_{3a}$) and is finally released after a lapse of a certain time period from completion of the releasing operation (t=$t_{3a}$).

On the contrary, in the attracting and releasing method of this embodiment, as shown in FIG. 5(b), the attraction voltage [V1] is applied at the same time as initiation of the attracting operation (t=0), after detecting the attraction, the attraction voltage [V1] is maintained until the attraction completion time (t=$t_1$). After the attraction completion time (t=$t_1$), a holding voltage [V3] is maintained until initiation of the releasing operation (t=$t_2$). Subsequently, a release voltage [−V4 (V4 is a positive number)] is applied at the same time as initiation of the releasing operation (t=$t_2$), and the release voltage [−V4] is maintained until completion of the releasing operation (t=$t_3$). Here, viewing the variation in the applied electric current values relative to the applied voltages, the glass substrate is attracted in a short actually measured attraction time period $t_c$ after application of the attraction voltage [V1]. Then, as the attraction state is maintained by the holding voltage [V3] which is obtained based on the attraction time period $t_c$ and which is lower than the attraction voltage [V1], the applied electric current is also reduced as compared to the conventional method. For this reason, electric charges are not excessively generated and the release of the glass substrate is completed in a short release time period $t_r$ even by use of the release voltage [−V4] which is obtained based on the attraction time period $t_c$ and which is smaller than the conventional release voltage [−V2].

In comparison between the conventional attracting and releasing method and the attracting and releasing method of this embodiment, it is apparent that the release time period $t_r$ in the attracting and releasing method of this embodiment is almost equal to ⅙ of a release time period $t_{ra}$ in the conventional attracting and releasing method. The attracting and releasing method of this embodiment has the significant effect. Moreover, the shorter release time period also means that the electric charges are not excessively generated. Since not only the release time period becomes shorter but also excessive surface potential is not generated, there are other effects in light of the process such as a capability of reducing effects on devices on the glass substrate 11 or a capability of reducing adhesion of particles.

Embodiment 2

Figure 6:
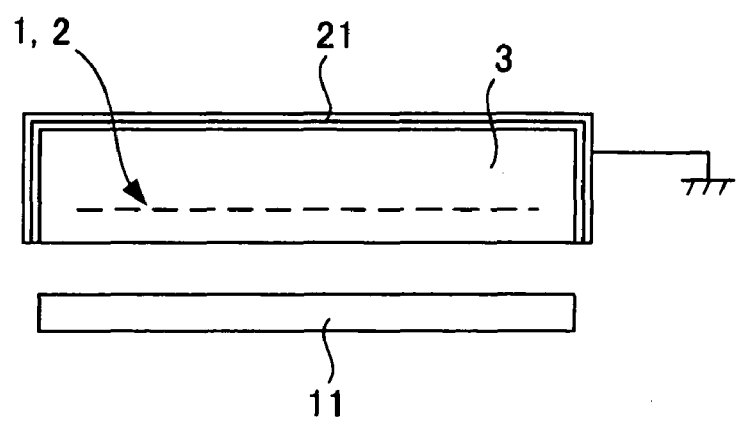
FIG. 6 is a schematic diagram showing another example of an embodiment of the electrostatic attraction apparatus for a glass substrate according to the present invention.
Figure 7A:
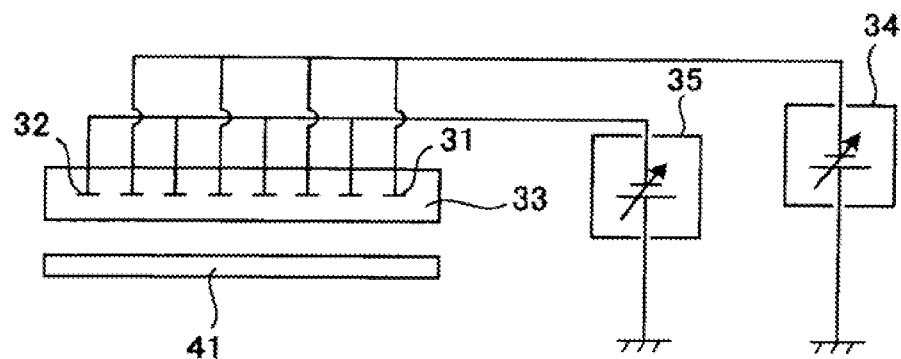
FIGS. 7(a) and 7(b) are schematic diagrams showing a conventional electrostatic attraction apparatus for a glass substrate.
Figure 7B:
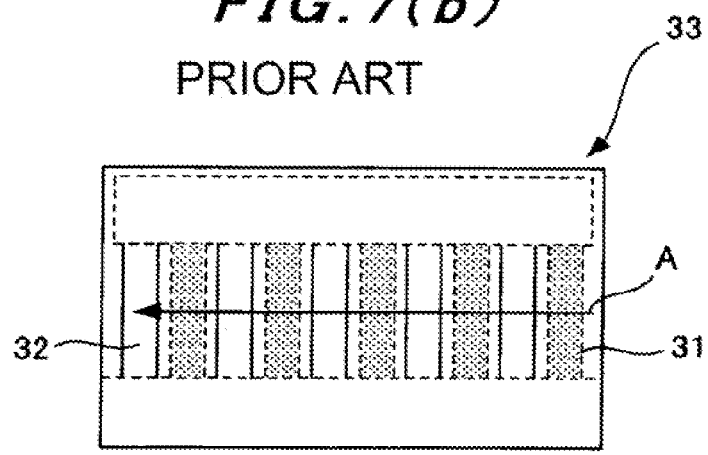
Figure 8:
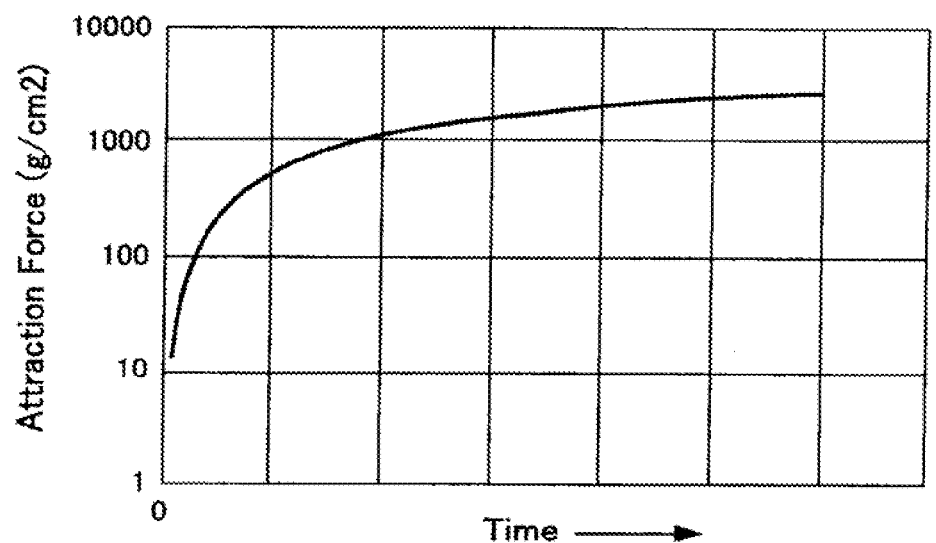
FIG. 8 is a graph showing a relation between an attraction force and an attraction time.
Figure 9A:
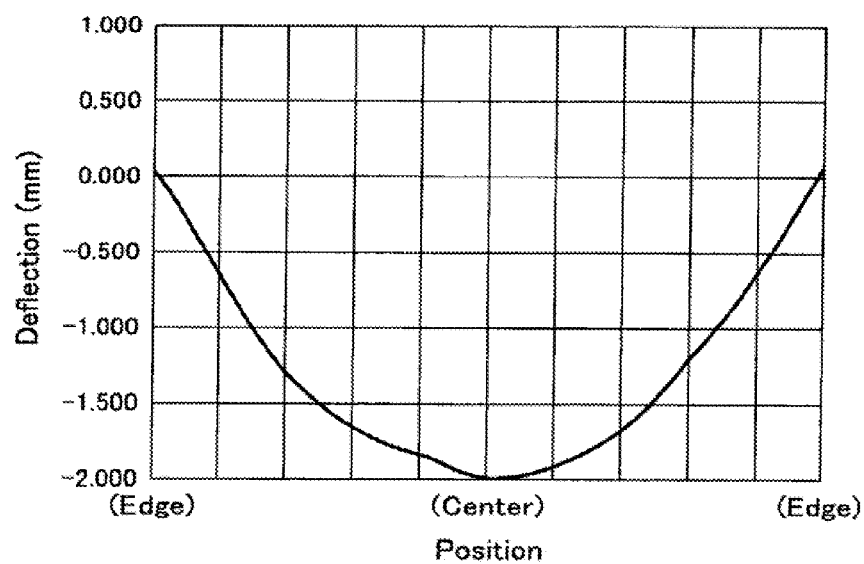
FIGS. 9(a) and 9(b) are graphs showing deflection attributable to the weight of the glass substrate and variation in the attraction force attributable to a gap.
Figure 9B:
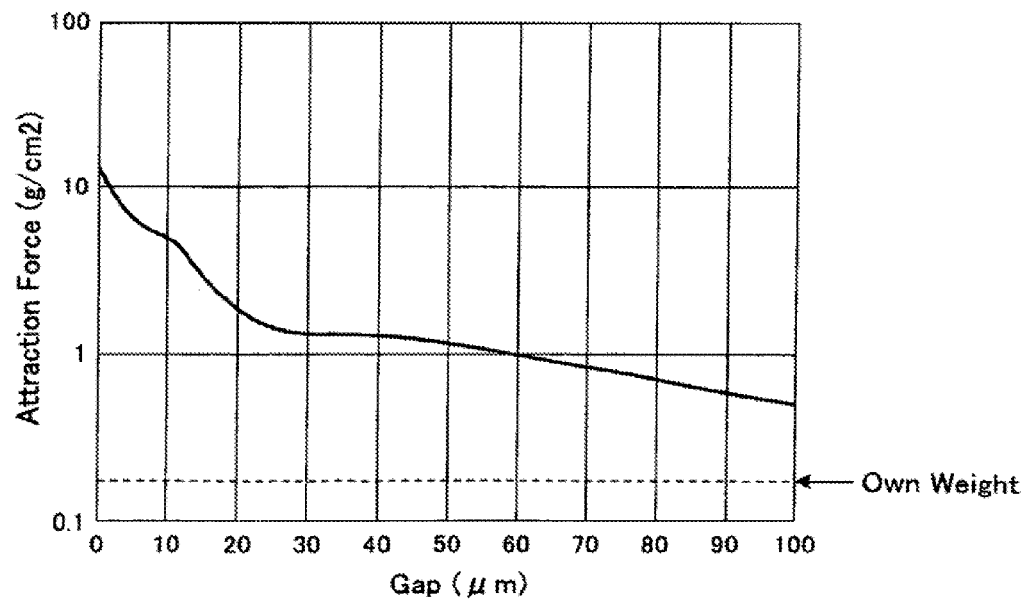
Figure 10:
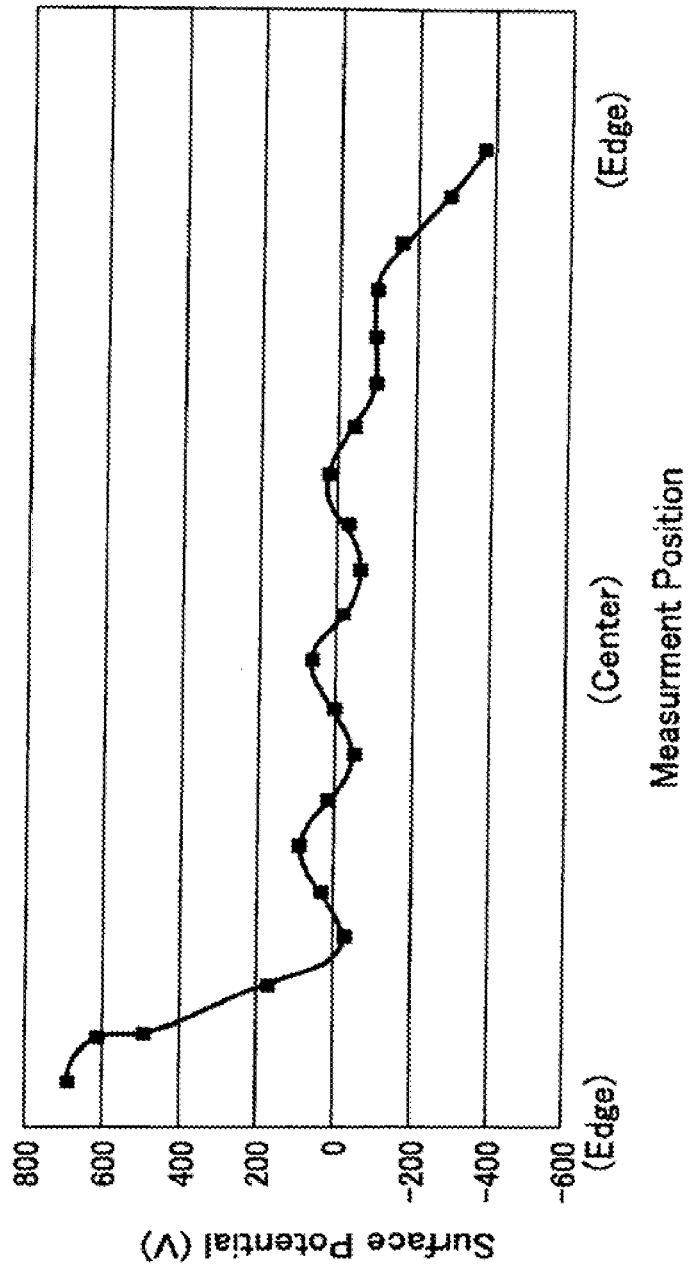
FIG. 10 is a graph showing a surface potential of the glass substrate on an attracting surface of the electrostatic attraction apparatus.
Figure 11A:
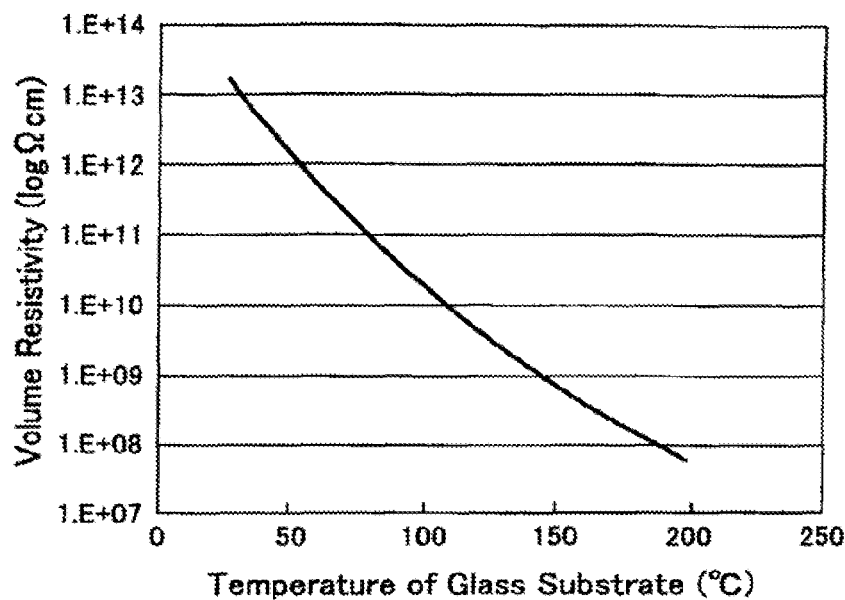
FIGS. 11(a) and 11(b) are graphs showing variation in volume resistivity of the glass substrate and variation in the attraction force with the temperature.
Figure 11B:
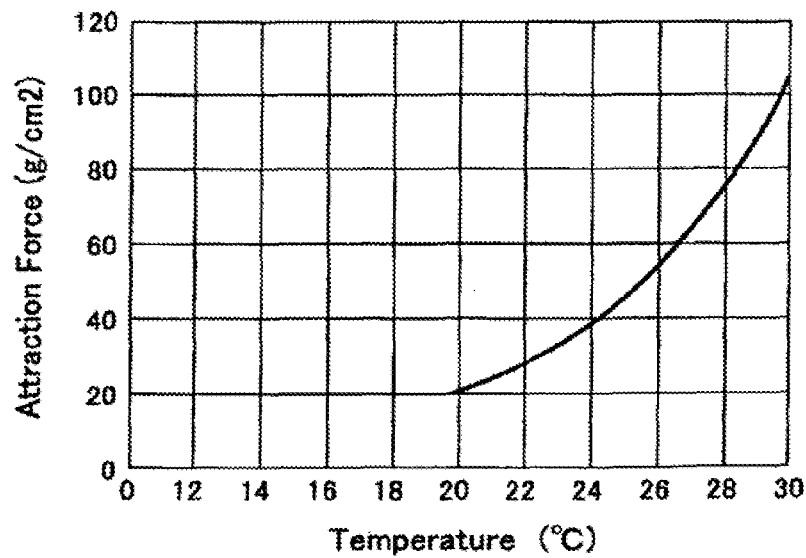

FIG. 6 is a schematic diagram showing another example of an embodiment of the electrostatic attraction apparatus for a glass substrate according to the present invention. In FIG. 6, the drawing is simplified for clarifying structures thereof while equivalents to the structures in Embodiment 1 shown in FIG. 1 are designated by the same reference numerals. Accordingly, detailed description of the equivalent structures will be omitted.

An electrostatic attraction apparatus for a glass substrate of this embodiment has almost equivalent structures to the electrostatic attraction apparatus for a glass substrate of Embodiment 1 shown in FIG. 1. However, as shown in FIG. 6, surfaces of an attraction plate 3 other than the attracting surface for attracting a glass substrate 11 is covered with a metal cover 21 made of a conductive member and the metal cover 21 is grounded at the same time. By shielding the attraction plate 3 other than the attracting surface with the metal cover 21, the surface potential of the attraction plate 3 other than the attracting surface can be 0. Accordingly, it is possible to prevent particles and the like from being charged and adhering to the attraction plate 3.

Therefore, adhesion of particles to the attraction plate 3 around the glass substrate 11 is prevented. Accordingly, it is also possible to prevent capture of particles in the space between the glass substrate 11 and the attraction plate 3 when the glass substrate 11 is attracted to the attraction plate 3 and also to suppress effects on the attraction force. Moreover, the adhesion of particles to the glass substrate 11 during the process can be suppressed.

INDUSTRIAL APPLICABILITY

The present invention is suitable for an insulative substrate such as a glass substrate and is applicable, for example, to organic EL manufacturing equipment or liquid crystal manufacturing equipment using a glass substrate.

The invention claimed is:

1. An electrostatic attraction apparatus for a glass substrate, comprising:
    an attraction plate made of a dielectric in which at least one first electrode and at least one second electrode are disposed inside;
    a first power source for applying a voltage to the first electrode;
    a second power source for applying a voltage, having an opposite polarity of the first electrode, to the second electrode;
    attraction detecting elements for detecting attraction of a glass substrate to the attraction plate;
    temperature detecting elements for measuring or estimating a temperature of the glass substrate; and
    controlling elements for controlling the voltages of the first power source and the second power source on the basis of detection results from the attraction detecting elements and the temperature detecting elements,
    wherein the glass substrate is electrostatically attracted to the attraction plate and then the glass substrate is released from the attraction plate by application of the voltages to the first electrode and the second electrode, and
    wherein the controlling elements presets a size, specific gravity, and electric resistivity of the glass substrate and presets an attraction time period necessary for attraction of the glass substrate, a holding time period for holding an attraction state of the glass substrate, and a release time period necessary for releasing the glass substrate,
    the controlling elements finds an attraction force necessary for attraction of the glass substrate on the basis of the size and the specific gravity of the glass substrate and the attraction time period,
    the controlling elements finds an attraction voltage necessary for obtaining the attraction force and finds a holding voltage for holding the attraction state and a release voltage for releasing on the basis of the electric resistivity and the temperature of the glass substrate measured or estimated by the temperature detecting elements,
    the controlling elements measures an actually measured attraction time period taken to complete attraction of the glass substrate when attraction of the glass substrate is detected by the attraction detecting elements after application of the attraction voltage,
    the controlling elements compares the preset attraction time period with the actually measured attraction time period, and recalculates the holding voltage and the release voltage based on the actually measured attraction time period when the preset attraction time period is different from the actually measured attraction time period, and
    the controlling elements holds the attraction state and releases the glass substrate by use of the recalculated holding voltage and the release voltage.

2. The electrostatic attraction apparatus for a glass substrate according to claim 1,
    wherein the controlling elements gradually reduces at least one of the attraction voltage, the holding voltage, and the release voltage with time.

3. The electrostatic attraction apparatus for a glass substrate according to claim 2, further comprising:
    a conductive member which covers surfaces of the attraction plate other than the attracting surface and which is grounded.

4. The electrostatic attraction apparatus for a glass substrate according to claim 2,
    wherein the attraction detecting elements is at least one of a first ammeter for measuring an electric current flowing to the first electrode and a second ammeter for measuring an electric current flowing to the second electrode, and
    the controlling elements detects the attraction of the glass substrate to the attraction plate by detecting a change in the electric current value flowing to any one of the first ammeter and the second ammeter.

5. The electrostatic attraction apparatus for a glass substrate according to claim 2,
    wherein the attraction detecting elements is a position sensor provided around an attracting surface of the attraction plate, and
    the controlling elements detects the attraction of the glass substrate to the attraction plate by using the position sensor.

6. The electrostatic attraction apparatus for a glass substrate according to claim 2, further comprising:
    deformation detecting elements for estimating or measuring the amount of deformation of the glass substrate,
    wherein the controlling elements finds the attraction force on the basis of the amount of deformation of the glass substrate thus estimated or measured.

7. The electrostatic attraction apparatus for a glass substrate according to claims 1,
    wherein the attraction detecting elements is at least one of a first ammeter for measuring an electric current flowing to the first electrode and a second ammeter for measuring an electric current flowing to the second electrode, and
    the controlling elements detects the attraction of the glass substrate to the attraction plate by detecting a change in the electric current value flowing to any one of the first ammeter and the second ammeter.

8. The electrostatic attraction apparatus for a glass substrate according to claim 7, further comprising:
    deformation detecting elements for estimating or measuring the amount of deformation of the glass substrate,
    wherein the controlling elements finds the attraction force on the basis of the amount of deformation of the glass substrate thus estimated or measured.

9. The electrostatic attraction apparatus for a glass substrate according to claim 7, further comprising:
    a conductive member which covers surfaces of the attraction plate other than the attracting surface and which is grounded.

10. The electrostatic attraction apparatus for a glass substrate according to claim 1,
    wherein the attraction detecting elements is a position sensor provided around an attracting surface of the attraction plate, and
    the controlling elements detects the attraction of the glass substrate to the attraction plate by using the position sensor.

11. The electrostatic attraction apparatus for a glass substrate according to claim 10, further comprising:
deformation detecting elements for estimating or measuring the amount of deformation of the glass substrate,
wherein the controlling elements finds the attraction force on the basis of the amount of deformation of the glass substrate thus estimated or measured.

12. The electrostatic attraction apparatus for a glass substrate according to claim 10, further comprising:
a conductive member which covers surfaces of the attraction plate other than the attracting surface and which is grounded.

13. The electrostatic attraction apparatus for a glass substrate according to claim 1, further comprising:
deformation detecting elements for estimating or measuring the amount of deformation of the glass substrate,
wherein the controlling elements finds the attraction force on the basis of the amount of deformation of the glass substrate thus estimated or measured.

14. The electrostatic attraction apparatus for a glass substrate according to claims 1, further comprising:
a conductive member which covers surfaces of the attraction plate other than the attracting surface and which is grounded.

15. A method of attracting and releasing a glass substrate, comprising:
presetting a size, specific gravity, and electric resistivity of a glass substrate and presetting an attraction time period necessary for attraction of the glass substrate, a holding time period for holding an attraction state of the glass substrate, and a release time period necessary for releasing the glass substrate;
finding an attraction force necessary for attraction of the glass substrate on the basis of the size and the specific gravity of the glass substrate and the attraction time period;
measuring or estimating a temperature of the glass substrate;
finding an attraction voltage necessary for obtaining the attraction force and finding a holding voltage for holding the attraction state and a release voltage for releasing on the basis of the electric resistivity and the temperature of the glass substrate thus measured or estimated;
measuring an actually measured attraction time period taken to complete attraction of the glass substrate by detecting attraction of the glass substrate after application of the attraction voltage;
comparing the preset attraction time period with the actually measured attraction time period, and recalculating the holding voltage and the release voltage on the basis of the actually measured attraction time period when the preset attraction time period is different from the actually measured attraction time period; and
holding the attraction state and then releasing the glass substrate by applying the recalculated holding voltage and the release voltage to at least one first electrode and at least one second electrode having mutually different polarities and being disposed inside the attraction plate made of a dielectric.

16. The method of attracting and releasing a glass substrate according to claim 15,
wherein at least one of the attraction voltage, the holding voltage, and the release voltage is gradually reduced with time.

17. The method of attracting and releasing a glass substrate according to claims 15,
wherein attraction of the glass substrate to the attraction plate is detected by detecting the change in at least one of electric current values flowing to the first electrode and the second electrode.

18. The method of attracting and releasing a glass substrate according to claims 15,
wherein attraction of the glass substrate to the attraction plate is detected by use of a position sensor provided around an attracting surface of the attraction plate.

19. The method of attracting and releasing a glass substrate according to claim 15,
wherein the amount of deformation of the glass substrate is estimated or measured, and the attraction force is found on the basis of the amount of the glass substrate thus estimated or measured.

20. The method of attracting and releasing a glass substrate according to claims 15,
wherein electric potential of the surfaces of the attraction plate other than the attracting surface is set equal to 0 by use of a conductive member which covers the surfaces of the attraction plate other than the attracting surface and is grounded.

* * * * *